United States Patent [19]

Nakano et al.

[11] Patent Number: 4,558,117

[45] Date of Patent: Dec. 10, 1985

[54] ORGANIC SOLVENT-SOLUBLE PHOTOSENSITIVE POLYIMIDE RESIN

[75] Inventors: Tsunetomo Nakano; Hiroshi Yasuno; Kazuaki Nishio, all of Ichihara, Japan

[73] Assignee: UBE Industries, Ltd., Yamaguchi, Japan

[21] Appl. No.: 615,309

[22] Filed: May 30, 1984

[30] Foreign Application Priority Data

May 30, 1983 [JP] Japan .................................. 58-95566

[51] Int. Cl.$^4$ ....................... C08G 73/10; C08G 73/12
[52] U.S. Cl. .................................... 528/184; 430/283; 430/287; 528/187; 528/188; 528/189
[58] Field of Search ............... 528/184, 187, 188, 189; 430/283, 287

[56] References Cited

U.S. PATENT DOCUMENTS

| | | | |
|---|---|---|---|
| 3,926,914 | 12/1975 | Miyadera et al. .................. | 528/188 |
| 4,168,360 | 9/1979 | D'Alelio ............................. | 528/188 |
| 4,321,198 | 3/1982 | D'Alelio et al. .................... | 528/188 |

*Primary Examiner*—Lester L. Lee
*Attorney, Agent, or Firm*—Burgess, Ryan & Wayne

[57] ABSTRACT

An organic solvent-soluble photosensitive polyimide resin having excellent heat resistance and electrical and mechanical properties, comprising a copolycondensation product of a biphenyltetracarboxylic acid component with an aromatic diamine component consisting of 40 to 90 molar % of a diamine compound of the formula (I) and 10 to 60 molar % of a diaminodiphenylether compound of the formula (II),

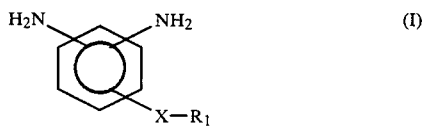

(I)

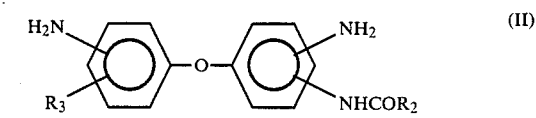

(II)

wherein X=—CO—O— or —CH$_2$—O—, R$_1$ and R$_2$=an organic residue having an ethylenically unsaturated radical, and R$_3$=H or —NHCOR$_2$.

7 Claims, No Drawings

ORGANIC SOLVENT-SOLUBLE PHOTOSENSITIVE POLYIMIDE RESIN

BACKGROUND OF THE INVENTION

1. Field of the Invention

The present invention relates to an organic solvent-soluble photosensitive polyimide resin. More particularly, the present invention relates to an aromatic polyimide resin having photosensitive radicals and exhibiting satisfactory solubility in certain types of organic solvents and useful for producing a photo-set product having excellent heat resistance and electrical and mechanical properties.

The organic solvent-soluble photosensitive polyimide resin of the present invention is useful in the semiconductor field as a material for forming insulating films and passivation films for solid-state elements and as an interlaminar insulating material for semiconductor integrated circuits and multilayer printed circuit boards.

2. Description of the Prior Art

In the semiconductor industry, materials for forming insulating films and passivation films for solid-state elements and interlaminar insulating materials for semiconductor integrated circuits and multilayer printed circuit boards must exhibit excellent heat resistance and elelctrical insulating properties.

Japanese Unexamined Patent Publication (Kokai) Nos. 49-115541, 54-116216, 54-116,217, 55-45,747, 55-45,748 and 56-45,915, for example, disclose passivation films produced by a polyimide resin having a high electrical insulating property as well as high heat resistance.

Most of the polymer resins disclosed in the above-mentioned publications are insoluble in organic solvents and have no photosensitive radicals. The other polymer resins which have photosensitive radicals are produced in such a manner that carboxylic acid radicals in the polyamic acid, which is a precursor of the polyimide resin, are modified by means of amidization or esterification. The modified polyamic acid resin is converted to the corresponding polyimide resin simultaneously with a photo-setting, process or by means of post-baking procedure after a photo-setting process.

Japanese Unexamined Patent Publication (Kokai) No. 54-109,828 discloses a heat-resistant photoresist composition which comprises a mixture of an organic solvent-soluble polyimide having no photosensitve radical with a monomeric compound having photo-setting radicals and capable of photo-setting. However, this type of composition exhibits an unsatisfactory photo-setting property. Also, the resultant photo-set resin exhibits unsatisfactory heat resistance.

Generally, it was believed that conventional aromatic polyimide resins having excellent heat resistance exhibited poor solubility in organic solvents and, therefore, were useless for the formation of relief patterns on a photosensitive resin material by the process of exposing a surface of a photosensitive material to actinic rays in accordance with a desired pattern, and then dissolving the non-exposed, non-photo-set portions of the photosensitive material by means of an organic solvent.

Japanese Unexamined Patent Publication (Kokai) No. 57-131,227 discloses a process for producing a polyimide having excellent photosensitivity and heat resistance by reacting a tetracarboxylic dianhydride with a diamine compound having photo-crosslinking unsaturated double bonds, for example, diaminochalcone. This type of polyimide exhibits excellent photosensitivity. The polyimide, however, exhibits poor solubility in organic solvents and therefore takes a long time to completely dissolve in the organic solvent. It is therefore, not useful for practical formation of relief patterns on photosensitive materials.

SUMMARY OF THE INVENTION

An object of the present invention is to provide an organic solvent-soluble photosensitive polyimide resin which is useful for producing a relief-patterned material having excellent heat resistance and electrical and mechanical properties.

The above-mentioned object can be attained by the organic solvent-soluble photosensitive polyimide resin of the present invention, which comprises a copolycondensation product of an aromatic tetracarboxylic acid component consisting of at least one member selected from the group consisting of biphenyltetracarboxylic acids and dianhydrides, esters and salts thereof with an aromatic diamine component consisting of 40 to 90 molar % of at least one aromatic diamine compound of the formula (I):

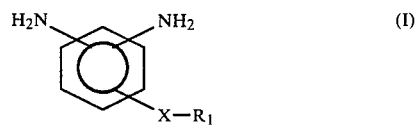

and 10 to 60 molar % of at least one aromatic diamine compound of the formula (II):

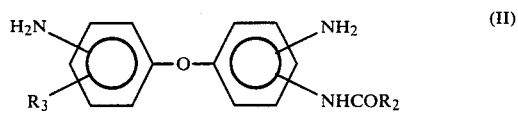

in which formulae (I) and (II) X represents a divalent radical selected from the group consisting of —CO—O— and —CH$_2$—O—, R$_1$ and R$_2$ respectively represent, independently from each other, an organic residue having an ethylenically unsaturated radical, and R$_3$ represents a member selected from the group consisting of a hydrogen atom and radicals of the formula —NHCOR$_2$, wherein R$_2$ is the same as defined above.

DESCRIPTION OF THE PREFERRED EMBODIMENTS

In the organic solvent-soluble photosensitive polyimide resin of the present invention, it is important that the aromatic diamine component to be reacted with the biphenyltetracarboxylic acid component consist of 40 to 90 molar % of at least one aromatic diamine compound of the formula (I) and 10 to 60 molar % of at least one aromatic diamine compound of the formula (II):

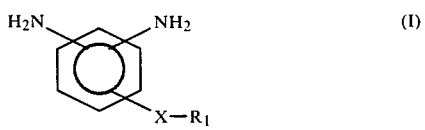

and

-continued

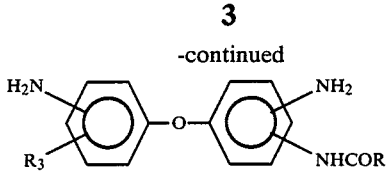

wherein X represents —CO—O— or —CH₂—O—, R₁ and R₂ respectively represent, independently from each other, an organic residue having an ethylenically unsaturated radical, and R₃ represents a hydrogen atom or —NHCOR₂, wherein R₂ is the same as defined above.

If the aromatic diamine component consists of the aromatic diamine compound of the formula (I) alone, the resultant polyimide resin is undesirably insoluble in organic solvents whereas the polyimide exhibits a satisfactory ultraviolet ray transmittance. If the content of the aromatic diamine compound of the formula (I) in the aromatic diamine component is more than 90 molar %, the resultant polyimide resin is also insoluble in organic solvents. If the content of the aromatic diamine compound of the formula (I) in the aromatic diamine component is less than 40 molar %, the resultant polyimide resin exhibits decreased ultraviolet ray transmittance and unsatisfactory photo-setting property.

The organic solvent-soluble photosensitive polyimide resin of the present invention is preferably prepared in a two-step process wherein the aromatic tetracarboxylic acid component polycondenses with the aromatic diamine components consisting of the two types of aromatic diamine compounds of the formulae (I) and (II) in an organic solvent at a relatively low temperature of 100° C. or less, preferably, 80° C. or less, for 1 to 48 hours, to provide an aromatic polyamic acid and then, after the resultant polyamic acid solution is diluted with an additional amount of the organic solvent, the polyamic acid is converted (imidized) to the corresponding polyimide by means of a dehydration cyclization reaction in the presence of an imidizing agent, for example, acetic anhydride, pyridine, or a tertiary amine at a temperature of 100° C. or less, preferably, 80° C. or less, for 0.5 to 5 hours.

The polyimide resin of the present invention may be produced in a single-step polycondensation imidization reaction of the aromatic tetracarboxylic acid component with the aromatic diamine component in an organic solvent at a relative high temperature of more than 100° C.

The above-mentioned polyimide-forming reaction of the acid and diamine components is carried out in an organic solvent consisting of, for example, at least one member selected from dimethylsulfoxide, N,N-dimethylformamide, N,N-diethylformamide, N,N-dimethylacetamide, N,N-diethylacetamide N-methyl-2-pyrrolidone, and hexamethylene phosphamide.

Usually, the above-mentioned two-step process is advantageous for obtaining stabilized polyimide resin.

The aromatic tetracarboxylic acid component and the aromatic diamine components are usually used in approximately equimolar amounts.

The aromatic tetracarboxylic acid component usable for the present invention consists of at least one member selected from the group consisting of biphenyltetracarboxylic acids, dianhydrides, esters, and salts thereof. The biphenyltetracarboxylic acid is preferably selected from the group consisting of 3,3',4,4'-biphenyltetracarboxylic acid, 2,2'3,3'-biphenyltetracarboxylic acid, and 2,3,3',4'-biphenyltetracarboxylic acid.

It is preferable that the aromatic tetracarboxylic acid component consist of a mixture of 25 to 75 molar % of at least one member selected from 3,3',4,4'-biphenyltetracarboxylic acid or dihydride, ester, or salt thereof and 2,2',3,3'-biphenyltetracarboxylic acid or dihydride, ester, or salt thereof, with 25 to 75 molar % of 2,3,3',4'-biphenyltetracarboxylic acid or dianhydride, ester, or salt thereof.

In the aromatic diamine compound of the formula (I), the organic residue represented by R₁ is preferably selected from the group consisting of those of the formulae:

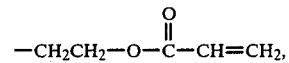

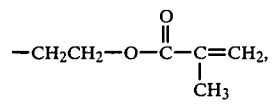

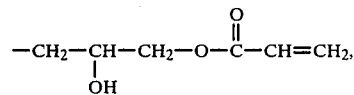

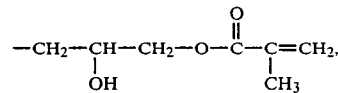

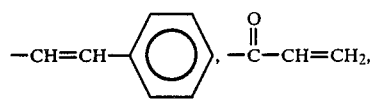

The aromatic diamine compound of the formula (I) is preferably selected from the group consisting of 3,5-diaminobenzoic acid ethyleneglycol monoacrylate ester, 3,5-diaminobenzoic acid ethyleneglycol monomethacrylate ester, 3,5-diaminobenzoic acid glycidyl acrylate ester, 3,5-diaminobenzoic acid glycidyl methacrylate ester, 3,5-diaminobenzoic acid cinnamic acid ester, 2,4-diaminobenzoic acid ethyleneglycol monoacrylate ester, 2,4-diaminobenzoic acid ethyleneglycol monomethacrylate ester, 2,4-diaminobenzoic acid glycidyl acrylate ester, 2,4-diaminobenzoic acid glycidyl mcthacrylate ester, 2,4-diaminobenzoic acid cinnamic acid ester, 3,5-diaminobenzyl acrylate, and 3,5-diaminobenzyl methacrylate.

In the aromatic diamine compound of the formula (II), the organic residue represented by R₂ is preferably selected from the group consisting of those of the formulae —CH=CH₂ and

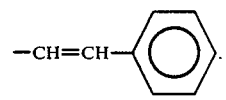

The aromatic diamine compound of the formula II is preferably selected from the group consisting of 4-acrylamido-3,4'-diaminodiphenylether, 4-cinnamamido- 3,4'-diaminodiphenylether, 3,4'-diacrylamido-3',4-diaminodiphenylether, and 3,4'-dicinnamamido-3',4-diaminodiphenylether.

The aromatic diamine compounds of the formula (II) are novel compounds and can be produced by any method. Preferably, the aromatic diamine compounds of the formula (II) are produced by reacting an ethylenically unsaturated carboxylic acid chloride, for example, acrylic acid chloride or cinnamic acid chloride, with mono or diaminodinitrodiphenyl ether which has been produced by the hydrolysis of mono or diacrylamidodinitrodiphenylether, and by reducing the resultant mono or diacrylamido-dinitrodiphenylether compound.

The aromatic diamine compounds of the formula (II) are effective for causing the resultant polyimide to exhibit an enhanced solubility in organic solvent without decreasing the photosensitivity of the resultant polyimide.

The photosensitive polyimide resin of the present invention preferably has a logarithmic viscosity of from 0.1 to 1.5, more preferably from 0.2 to 1.0, determined in a concentration of 0.5 g per 100 ml of N-methyl-2-pyrrolidone at a temperature of 30° C.

The organic solvent-soluble photosensitive polyimide resin of the present invention is useful as a material for forming a relief-patterned material. The photosensitive material is prepared, for example, from a solution of the polyimide resin dissolved preferably in a concentration of from 5% to 30% in an organic solvent consisting of, for example, at least one member selected from N,N-dimethylformamide, N,N-dimethylacetamide, N-methyl-2-pyrrolidone, dimethylsulfoxide, and hexamethylenephosphamide.

The polyimide solution for the photosensitive material may contain, if necessary, at least one member selected sensitizing agents, photopolymerization initiators, and photopolymerizable compounds having an ethylenically unsaturated radical.

The sensitizing agents and photopolymerization initiators preferably include Michler's ketone (N,N'-tetramethyl-4,4'-diaminobenzophenone), benzoin, benzoinmethylether, benzoinisopropylether, 2-tert-butylanthraquinone, 1,2-benzo-9,10-anthraquinone, 4,4'-bis (diethylamino) benzophenone, acetophenone, benzophenone, thioxanthone, and 1,5-acenaphthene, and are used in an amount of from 0.1 to 10 parts by weight per 100 parts by weight of the photosensitive polyimide resin.

The photopolymerizable compounds having an ethylenically unsaturated radical preferably include ethyleneglycol diacrylate and dimethacrylate, propyleneglycol diacrylate and dimethacrylate, tolumethylolpropane triacrylate and trimethacrylate, tetramethylolmethane tetracrylate and tetramethacrylate, N,N'-methylene bis-acrylate and bis-methacrylate, diethylaminoethyl acrylate and methacrylate, 1.3,5,-triacryloylhexahydros-triazine, and tris (hydroxyethylacryloyl) isocyanurate.

The photosensitive polyimide resin of the present invention can be used to prepare a relief-patterned printing plate in the following manner.

The photosensitive polyimide resin is dissolved in a desired concentration together with necessary additives in an organic solvent. The resultant solution is spread on a substrate and the solution layer is dried by evaporating away the solvent. The solution-spreading operation can be carried out by means of any coating devices, for example, a rotary coating machine. The drying operation is carried out usually at a temperature of 150° C. or less, preferably 100° C. or less. The drying operation may or may not be carried out under reduced pressure. After the drying operation is completed, a negative photomask chart having a desired pattern is placed on the resultant photosensitive polyimide resin layer surface, and actinic rays, for example, ultraviolet rays, visible light, electron beams, or X-rays are irradiated to the photosensitive polyimide resin layer through the photomask chart. Then, non-exposed, non-photoset portions of the photosensitive polyimide resin layer are removed by treating with a developing solution. The developing solution consists of a solvent consisting of at least one member selected from, for example, N,N-dimethylformamide, N,N-dimethylacetamide, dimethylsulfoxide, N-methyl-2-pyrrolidone, and hexamethylene phosphamide or a mixture of the above-mentioned solvent with methylalcohol and/or ethyl alcohol.

The polyimide resin of the present invention has excellent photosetting property and superior solubility in organic solvents and, therefore, is useful as a photosensitive material which can easily form a desired relief pattern by means of a photochemical reaction, without using additional photosetting material. Also, the polyimide resin of the present invention can be directly photo-set with no imidization step necessary for the photoset resin. A usual photosensitive material made from a photosensitive polyamic acid resin needs an imidization step for the polymeric acid resin after an image-forming photo-setting step for the photosensitive material is completed. Accordingly, the photosensitive material made from the photosensitive polyimide resin of the present invention is highly advantageous not only in that the image-forming operation can be carried out in a simplified easy process but also in that the resultant product exhibits an excellent heat stability and dimensional stability at an elevated temperature.

When the photosensitive polyimide resin of the present invention is photoset, the resultant product exhibits an excellent heat resistance, an insolubility in the organic solvents for the photosensitive polyimide resin and superior electrical and mechanical properties.

The relief-patterned material made from photosensitive polyimide resin of the present invention exhibits excellent heat resistance and electrical and mechanical properties and is useful not only as an insulating film and a passivation film for solid-state elements in semiconductor devices but also as an insulating film and a solder resist for multilayer circuit structure, for example, hybrid circuits and printed circuits. The present invention will be further explained by means of the following synthesis examples and other examples.

Synthesis Example 1

Preparation of 3,5-diaminobenzoic acid ethyleneglycol monomethacrylate ester

First Step (Synthesis of 3,5-dinitrobenzoic acid ethyleneglycol monomethacrylate ester)

A solution of 29.6 g of 2-hydroxyethyl methacrylate and 18.1 g of pyridine dissolved in 200 ml of tetrahydrofuran (THF) was added dropwise with a solution of 50 g of 3,5-dinitrobenzoic acid chloride at a temperature of 5° C. to 6° C. over a period of one hour by means of a dropping funnel. The resultant reaction mixture was stirred at a temperature of from 10° C. to 15° C. for one hour. The resultant hydrochloric acid pyridine salt deposited from the reaction mixture was separated by means of a Buchner funnel filter. The residual filtrate was concentrated and then was poured into water so as to form white-yellow precipitate.

The precipitate was washed several times by means of decantation and then dried under vacuum. 3,5-dinitrobenzoic acid ethyleneglycol monomethacrylate ester was obtained in an amount of 60 g.

Second Step (Reduction of 3,5-dinitrobenzoic acid ethyleneglycol monomethacrylate ester)

A solution of 5 g of the 3,5-dinitrobenzoic acid ethyleneglycol monomethacrylate ester obtained in the first step in 36 ml of acetic acid was added intermittently in amounts of from 2 to 4 ml each time to suspension of 27 g of iron powder in a mixture of 15 ml of water and 35 ml of acetic acid at a temperature of 25°±3° C. within a period of about 20 minutes while the resultant reaction mixture was stirred. Thereafter, the reaction mixture was additionally stirred for 10 minutes.

The reaction mixture was filtered by using a Buchner funnel to remove the excessive amount of the iron powder. The residual filtrate was cooled to a temperature of about 0° C. by adding pieces of ice. Thereafter, the pH of the filtrate was adjusted to about 8.0 by an aqueous ammonia solution. The filtrate was subjected to an extraction procedure with ethyl acetate. The resultant ethyl acetate extract solution was washed with water and dried and then, ethyl acetate was eliminated from the extract solution by means of evaporation at a temperature of 35° C. under a reduced pressure of about 20 mmHg.

The resultant crude product was obtained in an amount of 11.2 g (yield of 67.5%) and purified by means of column chromatography. In this purifying operation, the crude material was supplied to a column having a diameter of 65 mm and filled with 200 g of silica gel, available under the trademark fo Wakogel C-200 made by Wako Pure Chemical Industries, Ltd., and was purified by a developing solvent consisting of a mixture of ethyl acetate and benzene in the same volume as each other. The purified product was obtained in an amount of 7.8 g.

The resultant product exhibited the following properties.

Melting point: 88° C. to 89° C.
Element analysis (as $C_{13}H_{16}N_2O_2$)

|  | C | H | N |
|---|---|---|---|
| Measured (%) | 59.36 | 6.08 | 10.49 |
| Calculated (%) | 59.08 | 6.10 | 10.60 |

The product was subjected to infrared spectrophotometry and to H-NMR spectra analysis and was confirmed to be 3,5-diaminobenzoic acid ethyleneglycol monomethacrylate ester.

Synthesis Example 2

Preparation of 3,5-diaminobenzyl acrylate

First Step (Conversion of 3,5-dinitrobenzyl alcohol to corresponding acryloyl compound)

A solution of 40 g of 3,5-dinitrobenzyl alcohol dissolved in 400 ml of THF was added with 40.4 g of triethylamine. A solution of 20 g of acrylic acid chloride dissolved in 200 ml of THF was added dropwise to the above-mentioned 3,5-dinitrobenzyl alcohol solution at a temperature of from 3° C. to 4° C. over a period of 40 minutes while the resultant mixture was stirred. After the dropwise addition, the resultant reaction mixture was stirred for one hour.

The reaction mixture was filtered by means of a Buchner funnel, the resultant filtrate was placed in an evaporator under a reduced pressure to eliminate THF therefrom, and the resultant concentrated filtrate was poured to 2.5 l of water so as to allow the reaction product to precipitate. The precipitated reaction product was isolated by means of filtration. A crude dinitro compound was obtained in an amount of 46 g.

The crude dinitro compound was purified by means of column chromatography in the same manner as that described in Synthesis Example 1. The purified product was 42.5 g (corresponding to a yield of 84%) of 3,5-dinitrobenzyl acrylate in the form of light yellowish white crystals.

Second Step (Reduction of 3,5-dinitrobenzyl acrylate)

A solution of 20 g of 3,5-dinitrobenzyl acrylate prepared in the first step in 140 g of acetic acid was added intermittently by small amounts to a suspension of 140 g of iron powder in a mixture of 70 g of acetic acid with 70 g of water at a temperature of from 20° C. to 25° C. while the resultant reaction mixture was stirred.

After the above-mentioned reaction operation, the resultant reaction mixture was filtered to remove the iron powder, the resultant filtrate was neutralized with an aqueous ammonia solution, and the reaction product was extracted by 2.3 l of ethyl acetate. The extract solution was dried by means of anhydrous sodium sulfate and then the ethyl acetate solution phase was concentrated to an amount of 20 to 40 ml. The concentrated extract solution was subjected to the same column chromatography purifying procedure as that described in Synthesis Example 1, except that the column had a diameter of 50 mm and the developing solvent consisted of a mixture of 3 parts by volume of benzene with 2 parts by volume of ethyl acetate.

The purified product was in an amount of 10.5 g, corresponding to a yield of 68.9%, and in the form of white crystals. The results of element analysis of the purified product were as follows.

| Element analysis (as $C_{10}H_{12}N_2O_2$) | | | |
|---|---|---|---|
|  | C | H | N |
| Measured (%) | 62.24 | 6.46 | 14.58 |
| Calculated (%) | 62.49 | 6.29 | 14.57 |

As a result of infrared spectrophotometry and H-NMR spectra analysis, it was confirmed that the resultant product consisted of 3,5-diaminobenzyl acrylate.

Synthesis Example 3

Preparation of 4-acrylamido-3,4'-diaminodiphenylether

First Step (Hydrolysis of 4-acetylamido-3,4'-dinitrodiphenylether)

A Claisen alkali solution, prepared by dissolving 105 g of potassium hydroxide in 75 ml of water and by diluting the aqueous solution with methyl alcohol to a volume of 300 ml, was added in an amount of 300 ml to 60 g (0.19 mole) of 4-acetylamido-3,4'-dinitrodiphenyl ether. The resultant hydrolysis solution was heated at a temperature of 70° C. for 10 minutes and then was mixed with 1000 ml of water so as to allow the hydrolysis product to precipitate in the form of reddish orange crystals.

The precipitated crystals were collected and dried under reduced pressure.

The resultant 4-amino-3,4'-dinitrodiphenylether was obtained in an amount of 51.2 g, which corresponded to a yield of 98%.

Second Step (conversion of 4-amino-3,4'-dinitrodiphenylether to a corresponding acrylamido compound)

A solution of 66 g (0.72 mole) of acrylic acid chloride in 200 ml of THF was added dropwise to a solution of 50 g (0.18 mole) of 4-amino-3,4'-dinitrodiphenylether dissolved in a mixture of 800 ml of THF with 86 g (1.08 ml) of pyridine at room temperature over a period of 90 minutes, while allowing the temperature of the resultant reaction mixture to rise from 24° C. to 35° C. The reaction mixture was heated at a temperature of from 40° C. to 45° C. for one hour and then was cooled to room temperature. The reaction mixture was filtered, and the filtrate was concentrated to a volume of about 50 ml and then poured to 3 l of a 5% ammonia aqueous solution containing pieces of ice so as to allow the reaction product to precipitate in the form of crystals. The crystals were collected and dried at room temperature under reduced pressure. The dried product was purified by the same column chromatography as that described in Synthesis Example 1, except that the developing solvent consisted of benzene alone.

The purified product was 32.6 g (corresponding to a yield of 55%) of 4-acrylamido-3,4'-dinitrodiphenylether in the form of yelow crystals.

Third Step (Reduction of 4-acrylamido-3,4'-dinitrodiphenylether)

A solution of 16 g (0.05 mole) of the 4-acrylamido-3,4'-dinitrodiphenylether obtained in the above-mentioned second step and dissolved in 60 g of acetic acid was added intermittently by small amounts to a suspension of 27 g of iron powder in a mixture of 15 g of water with 15 g of acetic acid, while the resultant reaction mixture was stirred. Since the reaction in the reaction mixture was exothermic, the reaction mixture was cooled to a temperature of about 50° C. and was maintained at this temperature throughout the reaction.

After the reaction was completed, the reaction mixture was poured to 200 ml of ice water made alkaline by a 25% ammonia aqueous solution. The resultant alkaline solution was diluted by 600 ml of water. The reaction product in the diluted solution was extracted by a solvent consisting of 3 parts by volume of ethyl ether with one part by volume of ethyl acetate. The extract solution was dried by means of anhydrous sodium sulfate, and then the solvent was eliminated.

The reaction product was isolated in an amount of 8 g in a yield of 60%. The reaction product exhibited the melting point and element analysis results as shown below.

| Melting point: 105° C. to 106° C. Element analysis (as $C_{15}H_{15}N_3O_2$) | | | |
| --- | --- | --- | --- |
| | C | H | N |
| Measured (%) | 66.46 | 5.71 | 15.60 |
| Calculated (%) | 66.90 | 5.61 | 15.60 |

Also, it was confirmed by means of infrared spectrophotometry and H-NMR spectra analysis that the resultant reaction product was 4-acrylamido-3,4'-diaminodiphenylether.

EXAMPLE 1

A reaction mixture, prepared by dissolving 1.2 g of 2,3,3',4'-biphenyltetracarboxylic dianhydride, 0.75 g of 3,5-diaminobenzoic acid ethyleneglycol monomethacrylate ester, and 0.35 g of 4-acrylamido-3,4'-diaminodiphenylether in 8.9 ml of N-methyl-2-pyrrolidone (NMP), was stirred at a temperature of 30° C. for 24 hours to provide a polyamic acid.

The resultant polyamic acid solution was diluted with 33.4 ml of NMP and then mixed with 8.33 g of acetic anhydride, 3.19 g of pyridine, 6.5 ml of benzene, and 5.6 ml of NMP. The resultant imidization mixture was heated at a temperature of 50° C. for 2 hours.

The resultant polyimide solution was added with methyl alcohol dropwise so as to allow the resultant polyimide to precipitate. The precipitated polyimide resin was isolated by menas of filtration. The isolated polyimide resin was in the form of yellow powder.

EXAMPLE 2

A reaction mixture was prepared by dissolving 0.54 g of 2,3,3'4'-biphenyltetracarboxylic dianhydride, 0.66 g of 3,3'4,4'-biphenyltetracarboxylic dianhydride, 0.59 g of 3,5-diaminobenzoic acid ethyleneglycol monomethacrylate ester, and 0.49 g of 4-acrylamido-3,4'-diaminodiphenylether in 8.9 ml of NMP and was stirred at a temperature of 30° C. for 24 hours to provide a polyamic acid.

The resultant polyamic acid solution was diluted with 33.4 ml of NMP and then was added with 8.33 g of acetic anhydride, 3.19 g of pyridine, 6.5 ml of benzene, and 5.6 ml of NMP to provide an imidization mixture. The imidization mixture was heated at a temperature of 50° C. for 2 hours.

The resultant polyimide solution was added with methyl alcohol dropped thereinto to allow the resultant polyimide to precipitate from the solution. The precipitated polyimide in the form of yellow powder was collected by means of filtration.

EXAMPLE 3

A reaction mixture prepared by dissolving 0.470 g of 3,3'4,4'-biphenyltetracarboxylic dianhydride and 0.323 g of 4-acrylamido-3,4'-diaminodiphenylether in 7.9 ml of NMP was heated at a temperature of 30° C. for 4 hours and then was added with 0.706 g of 2,3,3',4'-biphenyltetracarboxylic acid and 0.538 g of 3,5-diaminobenzyl acrylate. The mixture was stirred at a temperature of 30° C. for 24 hours to provide a polyamic acid.

The resultant polyamic acid solution was diluted with 29.6 ml of NMP and then added with 8.1 g of acetic anhydride, 3.1 g of pyridine, 5.81 g of benzene, and 4.9 ml of NMP. The resultant imidization mixture was heated at a temperature of 50° C. for 2 hours.

The resultant polyimide resin was precipitated by dropping methyl alcohol to the imidization mixture and isolated in the form of yellow powder by means of filtration.

Physical properties of the polyimide resins prepared in Examples 1, 2, and 3

Each of the polyimide resins prepared in Examples 1, 2, and 3 were subjected to the following measurements.

(1) Viscosity

A logarithmic viscosity of the polyimide resin was determined in a solution of 0.5 g of the polyimide resin dissolved in 100 ml of NMP at a temperature of 30° C.

(2) Film-forming property

A film having a thickness of 10 microns was formed on a glass plate by the polyimide resin.

The film on the glass plate was immersed in water and peeled off from the glass plate. The degree of film-forming property was classified as follows.

Excellent: No crack was found in the peeled film.

Ordinary: No crack was formed in the filmforming step whereas cracks were formed in the peeling step.

Poor: Cracks were formed in the filmforming step.

(3) Solubility of polyimide resin in NMP

The amount (% by weight) of the polyimide resin dissolved in NMP at room temperature was measured.

(4) Solubility of polyimide resin film

A polyimide resin film having a thickness of 10 microns was produced from a 10% solution of a polyimide resin in NMP. The film was immersed in NMP at room temperature while stirring the mixture. The time necessary for completely dissolving the film was measured. The solubility of the polyimide resin film is represented by the dissolving time.

(5) Thermodecomposition-initiating temperature

The thermodecomposition-initiating temperature of a polyimide resin was represented by a weight decrease-initiating temperature of the polyimide resin measured by a differential thermobalance (Trademark TG-DSC, Rigaku Denki Co.)

(6) Photosetting properties

A solution of 10% by weight of a polyimide resin and 4 phr of Michler's ketone in NMP was spread on a glass plate by using a rotary coating machine at a speed of 2000 to 5000 rpm. The polyimide resin solution layer was dried at a temperature of 50° C. under a reduced pressure of 1 to 2 mmHg for 5 hours. The resultant polyimide resin film had a thickness of several microns and was subjected to the following tests.

(a) Photosensitivity test

The polyimide resin film was photo-set by exposing it to a superhigh pressure mercury lamp at an illuminance of 7.2 mW/cm$^2$ at a wavelength of 350 m$\mu$. A necessary quantity (J/cm$^2$) of actinic rays irradiated for completing the photo-setting of the polyimide resin film was measured.

(b) Resolving power test

The polyimide resin film was reliefpatterned by using a negative photomask test chart having a minimum line thickness of 0.98±0.25 micron (under a trademark of Toppan Test Chart N, Toppan Printing Co., Ltd.). The quantity of the resultant relief pattern was evaluated.

The results of the above-mentioned measurements and tests are shown in the following table.

|  |  |  | Example | | |
|---|---|---|---|---|---|
|  |  |  | 1 | 2 | 3 |
| Logarithmic viscosity |  |  | 0.25 | 0.41 | 0.37 |
| Film-foaming property |  |  | Excellent | Excellent | Excellent |
| Solubility in NMP (wt %) |  |  | >20 | >20 | >20 |
| Solubility of film (min) |  |  | 1 | 1 | 1 |
| Thermodecomposition-initiating temperature (°C.) |  |  | 320 | 340 | 317 |
| Photo-setting property | Photo-sensi-tivity | Thickness of film ($\mu$) | 4.0 | 3.0 | 4.5 |
|  |  | Quantity of irradiated actinic rays (J/cm$^2$) | 1.75 | 0.48 | 0.34 |
|  |  | Resolving power | Good | Good | Good |

Comparative Example 1

A reaction mixture was prepared by dissolving 1.23 g of benzophenonetetracarboxylic dianhydride and 1.00 g of 3,5-diaminobenzoic acid ethyleneglycol monomethacrylate ester in 8.8 ml of NMP and was stirred at a temperature of 30° C. for 24 hours. The resultant reaction mixture contained a polyamic-acid having a logarithmic viscosity of 0.85.

The polyamic acid solution was diluted with 32.9 ml of NMP and then was added with 7.84 g of acetic anhydride, 3.00 g of pyridine, 6.4 ml of benzene, and 5.5 ml of NMP. The resultant imidization mixture was heated at a temperature of 50° C. Ten minutes after the start of the reaction, yellow polyimide resin particles were deposited. The imidization mixture was maintained at this temperature further for 120 minutes.

The deposited yellow polyimide particles were separated from the mixture by means of filtration. An attempt was made to dissolve 10 g of the polyimide resin in 10 ml of NMP. However, it was found that no polyimide resin dissolved in NMP.

Therefore, it was impossible to subject the polyimide resin to the photosensitivity test and the resolving power test.

Comparative Example 2

A reaction mixture was prepared by dissolving 1.46 g of pyromellitic dianhydride, 0.92 g of 3,5-diaminobenzoic acid ethyleneglycol monomethacrylate ester, and 0.70 g of 4,4'-diaminodiphenylether in 12.0 ml of NMP and was stirred at a temperature of 30° C. for 24 hours. The resultant reaction mixture contained a polyamic acid having a logarithmic viscosity of 0.43.

The polyamic acid solution was diluted with 45.0 ml of NMP and then was added with 14.28 g of acetic anhydride, 5.46 g of pyridine, 8.8 ml of benzene, and 7.5 ml of NMP. The resultant imidization mixture was heated at a temperature of 50° C. Twenty minutes after the start of the reaction, yellow polyimide resin particles deposited. The imidization mixture was maintained at this temperature further for 120 minutes.

The deposited yellow polyimide particles were separated from the mixture by means of filtration. An attempt was made to dissolve 10 g of the polyimide resin in 10 ml of NMP. However, it was found that no polyimide resin dissolved in NMP.

Therefore, it was impossible to subject the polyimide resin to the photosensitivity test and the resolving power test.

We claim:

1. An organic solvent-soluble photosensitive polyimide resin comprising a copolycondensation product of an aromatic tetracarboxylic acid component consisting of at least one member selected from the group consisting of biphenyltetracarboxylic acids and dianhydrides, esters and salts thereof with an aromatic diamine component consisting of 40 to 90 molar % of at least one aromatic diamine compound of the formula (I):

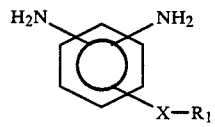 (I)

and 10 to 60 molar % of at least one aromatic diamine compound of the formula (II):

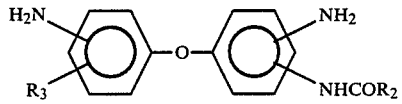 (II)

in which formulae (I) and (II) X represents a divalent radical selected from the group consisting of —CO—O— and —CH$_2$—O—, R$_1$ and R$_2$ respectively represent, independently from each other, an organic residue having an ethylenically unsaturated radical, and R$_3$ represents a member selected from the group consisting of a hydrogen atom and radicals of the formula —NHCOR$_2$, wherein R$_2$ is the same as defined above.

2. The photosensitive polyimide resin as claimed in claim 1, wherein said biphenyltetracarboxylic acid is selected from the group consisting of 3,3′4,4′-biphenyltetracarboxylic acid, 2,2′,3,3′-biphenyltetracarboxylic acid, and 2,3,3′,4′-biphenyltetracarboxylic acid.

3. The photosensitive polyimide resin as claimed in claim 1, wherein the organic residue represented by R$_1$ in the formula (I) is selected from the group consisting of those of the formulae:

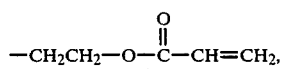

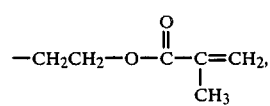

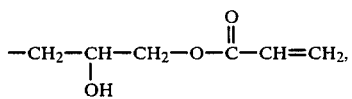

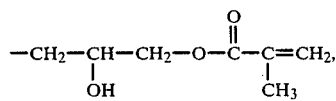

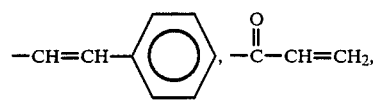

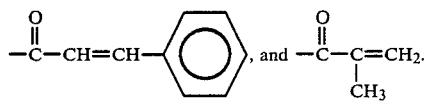

4. The photosensitive polyimide resin as claimed in claim 1, wherein the organic residue represented by R$_2$ in the formula (II) is selected from the group consisting of those of the formulae —CH=CH$_2$ and

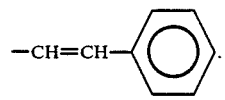

5. The photosensitive polyimide resin as claimed in claim 1, wherein said aromatic diamine compound of the formula (I) is selected from the group consisting of 3,5-diaminobenzoic acid ethyleneglycol monoacrylate ester, 3,5-diaminobenzoic acid ethyleneglycol monomethacrylate ester, 3,5-diaminobenzoic acid glycidyl acrylate ester, 3,5-diaminobenzoic acid glycidyl methacrylate ester, 3,5-diaminobenzoic acid cinnamic acid ester, 2,4-diaminobenzoic acid ethyleneglycol monoacrylate ester, 2,4-diaminobenzoic acid ethyleneglycol monomethacrylate ester, 2,4-diaminobenzoic acid glycidyl acrylate ester, 2,4-diaminobenzoic acid glycidyl methacrylate ester, 2,4-diaminobenzoic acid cinnamic acid ester, 3,5-diaminobenzyl acrylate, and 3,5-diaminobenzyl methacrylate.

6. The photosensitive polyimide resin as claimed in claim 1, wherein said aromatic diamine compound of the formula (II) is selected from the group consisting of 4-acrylamido-3,4′-diaminodiphenylether, 4-cinnamamido-3,4′-diaminodiphenylether, 3,4′-diacrylamido-3′4-diaminodiphenylether, and 3,4′-dicinnamamido-3′,4-diaminodiphenylether.

7. The photosensitive polyamide resin as claimed in claim 1, wherein said aromatic tetracarboxylic acid component consists of 25 to 75 molar parts of at least one member selected from the group consisting of 3,3′,4,4′-biphenyltetracarboxylic acid, 2,2′,3,3′-biphenyltetracarboxylic acid and dianhydrides, esters, and salts of the above-mentioned acids and 25 to 75 molar parts of at least one member selected from the group consisting of 2,3,3′,4′-biphenyltetracarboxylic acid and dianhydride, esters, and salts thereof.

* * * * *